United States Patent [19]

Miyamoto et al.

[11] Patent Number: 5,165,411

[45] Date of Patent: Nov. 24, 1992

[54] MAGNETIC RESONANCE IMAGING METHOD

[75] Inventors: Yoshiyuki Miyamoto, Katsuta; Ryuzaburo Takeda; Toshiaki Aritomi, both of Ibaraki, all of Japan

[73] Assignee: Hitachi, Ltd., Tokyo, Japan

[21] Appl. No.: 672,757

[22] Filed: Mar. 22, 1991

Related U.S. Application Data

[63] Continuation of Ser. No. 313,861, Feb. 23, 1989, abandoned.

[30] Foreign Application Priority Data

Feb. 26, 1988 [JP] Japan ................................. 63-42038

[51] Int. Cl.$^5$ ............................................. A61B 5/055
[52] U.S. Cl. ................................. 128/653.2; 324/309; 324/312
[58] Field of Search ............... 128/653.2; 324/309, 324/312; 364/413.13

[56] References Cited

U.S. PATENT DOCUMENTS

| | | | |
|---|---|---|---|
| 4,663,591 | 5/1987 | Pelc et al. ........................ | 128/653 |
| 4,682,110 | 7/1987 | den Boef ........................... | 324/309 |
| 4,727,882 | 3/1988 | Schneider et al. ................. | 128/653 |
| 4,728,890 | 3/1988 | Pattany et al. .................... | 128/653 |
| 4,730,260 | 3/1988 | Bailes ................................ | 127/653 |
| 4,740,750 | 4/1988 | Machida ............................ | 324/312 |
| 4,746,865 | 5/1988 | Kasugai ............................. | 324/309 |

OTHER PUBLICATIONS

Haacke et al, *Reducing Motion Artifacts in Two-Dimensional Fourier Transform Imaging*, Mag Res Imaging, vol. 4, pp. 359-376 (1986).

*Primary Examiner*—Ruth S. Smith
*Attorney, Agent, or Firm*—Antonelli, Terry Stout & Kraus

[57] ABSTRACT

A radio frequency magnetic field is applied to a sample or object to be examined which is placed in a static magnetic field and oscillates periodically, and nuclear magnetic resonance signals are generated from the sample. The NMR signal is transformed to a signal having a form wherein a still image component and an artifact component resulting from the periodic oscillation, that are contained in the NMR signal, are mutually separated, and then processing is applied to the signal thus transformed so as to remove the artifact component therefrom. Inverse transform to the transform described above is applied to the signal thus processed.

14 Claims, 4 Drawing Sheets

MAGNETIC RESONANCE IMAGING METHOD

This application is a continuation of application Ser. No. 313,861, filed Feb. 23, 1989 now abandoned.

BACKGROUND OF THE INVENTION

1. Field of the Invention

This invention relates generally to a magnetic resonance imaging method, and more particularly to a magnetic resonance imaging method which will be suitable for removing an artifact resulting from the respiratory motion when the image of the abdominal region of a person is formed.

2. Description of the Prior Art

The nuclear magnetic resonance signal S(t, n) (hereinafter referred to as the "NMR signal") obtained from a movable sample is expressed by the following formula as will be described later in further detail:

$$S(t, n) = S_o(t, n) \exp(j\Delta\theta(n)) \quad (1)$$

Here, $S_o$ (t, n) is the NMR signal from the sample at rest and $\Delta\theta(n)$ is the phase shift of the NMR signal resulting from motion. When the sample oscillates periodically, this $\Delta\theta(n)$ becomes a periodic function and results in a motion artifact. The technique of removing the motion artifact is the one that processes this $\Delta\theta(n)$ and has been improved since 1984 to the present moment through the following first to fourth stages.

The technique of the first stage detects the respiration and the body motion by use of an air bag, bellows, or the like, and conducts imaging in synchronism with them, as described, for example, in Japanese Patent Laid-Open Nos. 77747/1985, 25542/1986 and 154655/1986. This system keeps the $\Delta\theta(n)$ value in the formula (1) constant and removes the motion artifact. However, this system involves the problems that the imaging time is long, and that a specific apparatus must be fitted to the sample or the object to be examined.

Therefore, the technique of the second stage has been proposed which selects the quantity of phase encode in accordance with the detected body motion, collects signal data and later rearranges the data (e.g. "NMR Medical Science", Vol. 6, S.1, p.183 (1986)). This means that $\Delta\theta(n)$ in the formula is not the periodic function based on the respiration period but is transformed to a suitable form. Though this technique can reduce the imaging time as the problem of the first stage technique, the problem of fitting of a specific apparatus yet remains unsolved. Since the fitting of the specific apparatus is uncomfortable to the patient, a system not requiring the detector has been desired earnestly.

Recently, the system of the third stage which does not require the detector of the respiration and body motion has been proposed. The system of the the third stage includes the following systems.

3-1) The phase encoding gradient sequence is made non-monotonic, and rearrangement is made after signal data collection to eliminate periodicity of body motion and to remove the artifact. In other words, this system eliminates periodicity of $\Delta\theta(n)$ and converts it to noise (e.g. Japanese Patent Laid-Open Nos. 124855/1986 and 155740/1986).

3-2) The system in which the repetition time of the pulse sequence is set to some multiples by an odd-number of ¼ of the oscillation period so that the influences of the body motion are imaged at positions where they do not interfere with the original image, that is, at both ends of the field of view. In other words, this system sets the repetition time so that $\Delta\theta(n)$ has a suitable form (e.g. Japanese Patent Laid-Open No. 128953/1986).

3-3) The system which makes some contrivances to the pulse sequence so that the speed and acceleration of the sample do not affect the phase component of the NMR signal and thus removes the artifact. In other words, this is the system which keeps always $\Delta\theta(n)=0$ by making some contrivances to the pulse sequence (e.g. "NMR Medical Science", Vol. 7, S.1, p.73 (1987)).

Furthermore, the idea of the fourth stage has been proposed. This is the system which samples only $\Delta\theta(n)$ as a separate signal and corrects the signals for the image (e.g. Japanese Patent Laid-Open Nos. 133850/1986 and 20541/1986).

However, the techniques of the first and second stages are not preferable because the specific apparatus fitted to the patient or sample makes the patient uncomfortable. The technique of the fourth stage will be omitted from this discussion because its effect over the technique of the third stage cannot be evaluated quantitatively.

Now, the problems with the technique of the third stage will be discussed in detail. According to the system (3-1), the apparent occurrence of artifact becomes smaller but since $\Delta\theta(n)$ is dealt with as noise, its influences are distributed as the noise throughout the image.

The technique (3-2) imposes limitation to the repetition time due to the respiratory period of the patient or sample. The repetition time is one of the important parameters of imaging and any limitation to this factor is not preferable.

Since the technique (3-3) makes the pulse sequence complicated, the minimum echo time that can be attained becomes long. This echo time, too, is another important parameter of imaging and any limitation to it is not preferable, either.

SUMMARY OF THE INVENTION

It is therefore an object of the present invention to provide a magnetic resonance imaging method which can eliminate the artifact resulting from oscillation of a sample or object to be examined.

It is another object of the present invention to provide a magnetic resonance imaging method which can eliminate the artifact resulting from oscillation of a sample or object to be examined without the drop of an signal-to-noise ratio (S/N).

It is still another object of the present invention to provide a magnetic resonance imaging method which can eliminate the artifact resulting from oscillation of a sample or object to be examined without imposing any limitation to the imaging condition, in particular.

In accordance with the present invention, a radio frequency magnetic field is applied to a sample or object to be examined which is placed in a static magnetic field and oscillates periodically, so that a nuclear magnetic resonance (NMR) signal is generated from the sample or object. Image reconstruction processing is made for the NMR signal to obtain the image of the sample or object.

The NMR signal is converted into the signal of the form wherein the still image component and the artifact component based on the periodical oscillation that are contained in the NMR signal, and the signal thus converted is then processed so that the artifact component is removed therefrom. Conversion is then made to the signal thus processed in the reverse way to the conversion described above.

Such a processing may be carried out either during or after the image reconstruction processing.

The above and other objects and novel features of the present invention will become more apparent from the following detailed description when taken in conjunction with the accompanying drawings.

DESCRIPTION OF THE PREFERRED EMBODIMENTS

Figure 1:
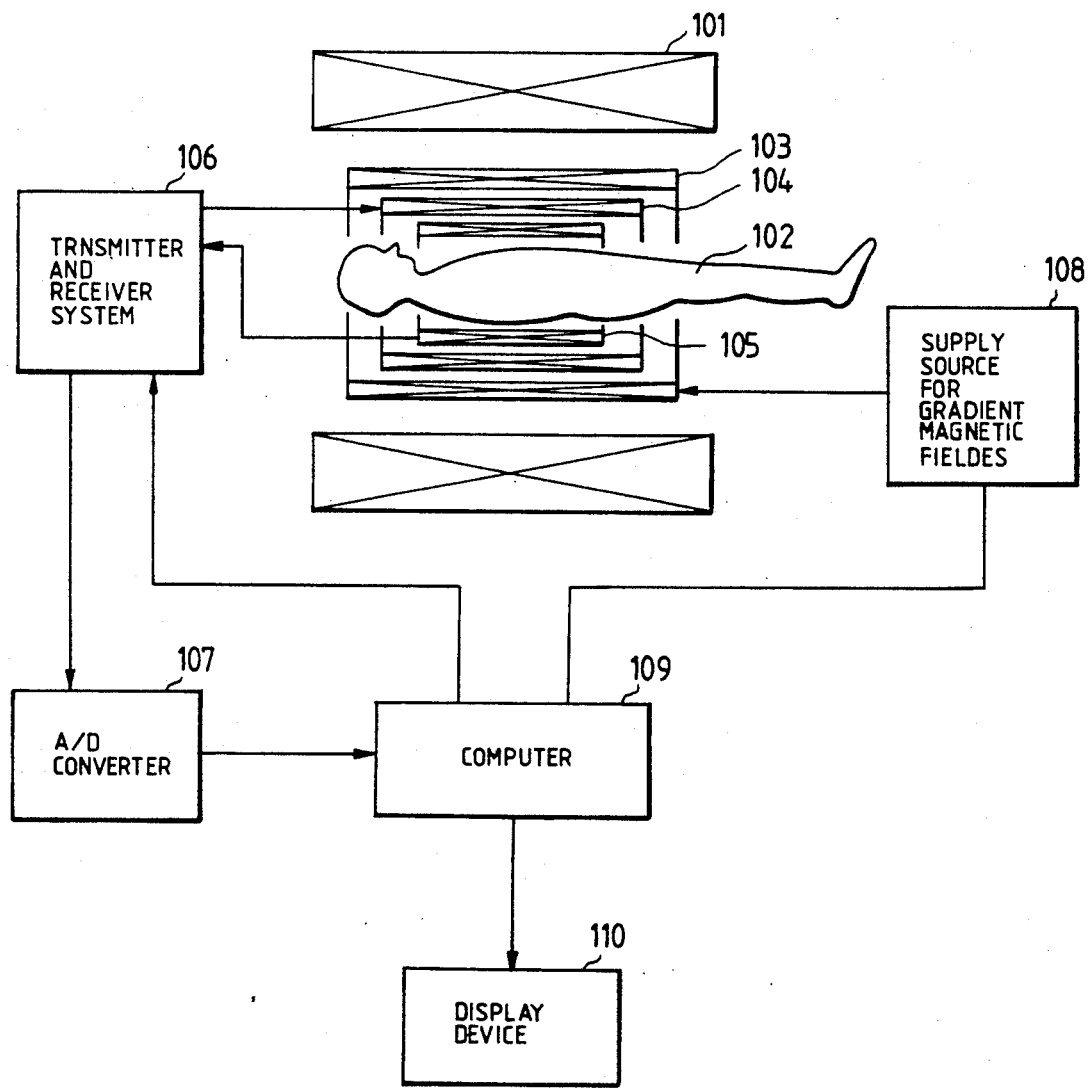
FIG. 1 is a block diagram of a magnetic resonance imaging apparatus in accordance with one embodiment of the present invention.

Referring to FIG. 1, a sample or object to be examined 102 is placed in a magnet 101 generating a uniform magnetic field, and radio frequency necessary for causing nuclear magnetic resonance for the proton ($^1$H) in the sample is generated by a transmitter-and-receiver system 106. This radio frequency is applied to the sample 102 by a transmission coil 104. After the radiation is made for a predetermined period, the nuclear magnetic resonance (NMR) signal generated by the portion in the sample is detected by a reception coil 105, and the resulting resonance signal is converted into an audio frequency by the transmitter-and-receiver system 106 and then into a digital signal by an A/D convertor 107. A computer 109 makes necessary processing of this signal and displays a resulting image on a display device 110. The gradient magnetic field for providing the field gradient in X, Y and Z directions, which are necessary for encoding spatial information necessary for imaging into the signal is applied by a gradient field supply source 108 controlled by the computer 109 so as to satisfy a predetermined condition and by gradient field coil device 103 in the X, Y and Z directions connected to the supply source 108. The transmitter-and-receiver system 106, too, is likewise controlled by the computer 109.

Figure 2:
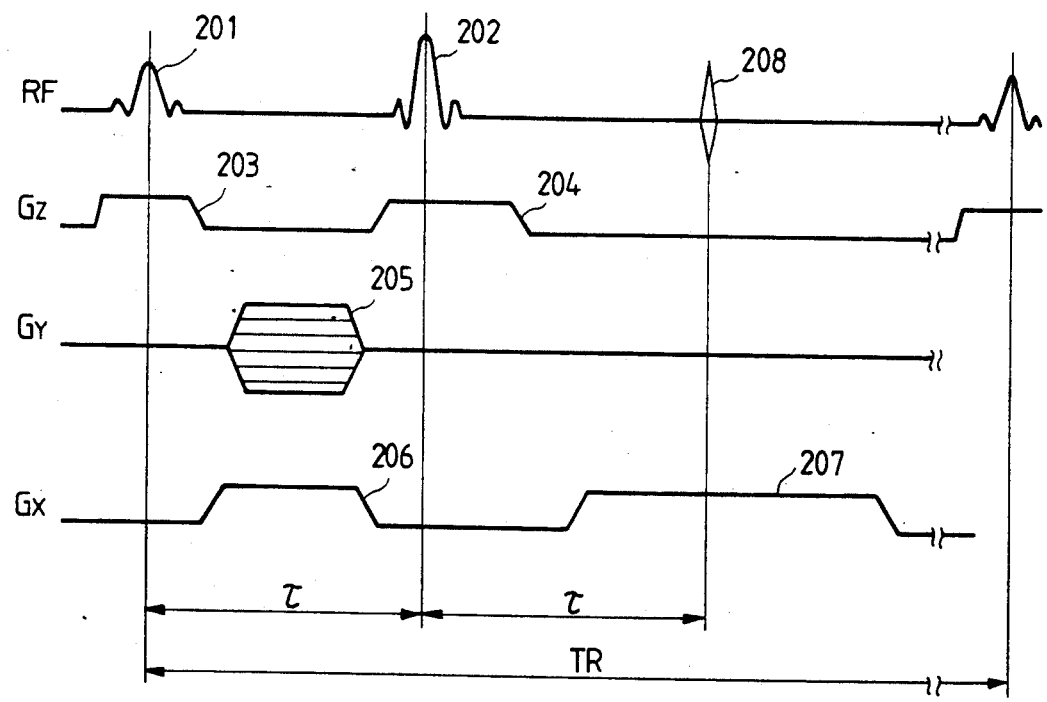
FIG. 2 is a diagram showing the pulse sequence used for the apparatus shown in FIG. 1.

Referring to FIG. 2, a selective radio frequency 90° pulse 201 for providing the radio frequency magnetic field is applied to the sample in the presence of the field gradient $G_Z$ represented by reference numeral 203. Accordingly, a slice which is perpendicular to the Z axis is excited selectively. In other words, the nuclear spins in this slice are selectively tipped by 90°, and the tipped spins are sequentially dispersed.

After the passage of $\tau$ time, the field gradient $G_Z$ represented by 204 and the selective radio frequency 180° pulse 202 for providing the radio frequency field are applied so that the nuclear spins in the selectively excited slice are inverted. Therefore, the dispersed spins are gradually focused and a time after the selective radio frequency 180° pulse 202, a nuclear magnetic resonance signal 208 which is referred to as an "echo signal" is generated from the slice as a whole.

The field gradient $G_Y$ represented by reference numeral 205 is applied between the selective radio frequency 90° pulse 201 and the selective radio frequency 180° pulse 202 and the field gradient $G_X$ 207 is applied after the selective radio frequency 180° pulse 202. The NMR signal 208 is read out during application of the field gradient $G_X$.

The steps described above are repeated N times in a time interval $T_R$ so as to generate N NMR signals. However, the magnitude of the field gradient $G_Y$ is changed each repetition so that its time integration value changes by a constant quantity. Sampling is made N times for each of N NMR signals and two-dimensional Fourier transform is applied to the N NMR signals each consisting of N sampled signals in order to obtain the NMR image consisting of N×N element images. There is thus obtained the two-dimensional image of the X-Y plane of the slice.

The image reconstruction processings described above are all executed by the computer 109.

The field gradient $G_X$ represented by reference numeral 206 is applied between the selective radio frequency 90° pulse 203 and the selective radio frequency 180° pulse 202. This field is applied in order to compensate for dephasing of the nuclear spins in the slice that occurs due to the field gradient $G_X$ represented by reference numeral 207.

Since this field gradient $G_X$ 207 is used so as to establish correspondence between the frequency of the NMR signal and its resonance signal occurring position, it is referred to as a frequency encoding field gradient. The reason why the amplitude of the field gradient $G_Y$ is changed whenever the sequence is repeated in the time interval $T_R$ is that the correspondence can be established between the change of the phase of the NMR signal and its signal occurring position. Therefore, the field gradient $G_Y$ is referred to as the phase encoding field gradient.

When a stationary hydrogen atom having a density $\eta$ exists at one pixel corresponding to one element image in the slice plane and its position is encoded into a frequency $\omega k$ and into the phase change $\theta_l$ by the frequency encoding field gradient $G_X$ and by the phase encoding field gradient $G_Y$, respectively, the NMR signal $S_o(t, n)$ can be expressed as follows:

$$S_o(t,n) = \rho \exp(j\omega_k t)\exp(j\theta_l n) \tag{2}$$

If the signal of the formula (2) is subjected to Fourier transform with respect to $t_x$ and $G_Y$ with $t_x$ representing the application time of the gradient field 207, there can be obtained the following formulas (3) and (4). It can be said that Fourier transform is made in the direction of the time axis as to the formula (3) and in the direction of the phase axis as to the formula (4).

$$S_o(\omega,n) = \rho\delta(\omega-\omega_k)\exp(j\theta_l n) \tag{3}$$

$$S_o(\omega,\theta) = \rho\delta(\omega-\omega_k)\delta(\theta-\theta_l) \tag{4}$$

In this manner the NMR signal can be converted into an image signal having an intensity $\rho$ at the point $(\omega_k, \theta_l)$ on the $\omega\theta$ plane.

Next, the cause for the occurrence of artifact will be explained. As described above, it is the phase encoding field gradient that provides the phase change of the NMR signal from the stationary object but the other field gradients do not provide such a phase change. If any motion exists, however, the phase shift is generated in accordance with its speed and acceleration by the other field gradients. In such a case, the NMR signal expressed by the formula (2) changes as follows:

$$S(t,n) = \rho \exp\{j(\omega_k + \Delta\omega_k(n))t\}\exp\{j(\theta_j m + \Delta\theta(n))\} \quad (5)$$

$\Delta\omega_k(n)$ is the frequency shift due to the position shift and $\theta(n)$ is the phase shift due to the speed and acceleration. $\Delta\omega_k(n)$ results in ambiguity of the image and if $\Delta\theta(n)$ is a periodic function, this results in the artifact of the image. If the influence of ambiguity is neglected, $$S(t,n) = S_o(t,n)\exp(j\Delta\theta(n)) \quad (6)$$

If this is subjected to Fourier transform in the directions of the time axis and phase axis, then $$S(\omega,\theta) = S_o(\omega,\theta)*F[\exp(j\Delta\theta(n))] \quad (7)$$

where * is convolution, $S_o(\omega,\theta)$ is the sitll image component expressed by formula (4) and F [,] represents the Fourier transform in the direction of the phase axis. Since $\Delta\theta(n)$ is the periodic function, $\exp(j\Delta\theta(n))$, too, is a periodic function, and can be develòped to the Fourier series. In other words, it can be developed to:

$$\exp(j\Delta\theta(n)) = 1 + a_1 e^{j\frac{2\pi}{T}n} + a_2 e^{j\frac{4\pi}{T}n} + a_3 e^{j\frac{6\pi}{T}n} + \ldots \quad (8)$$

with T representing the period.
Therefore, $$\begin{aligned}F[\exp(j\Delta\theta(n))] &= F[1 + a_1 e^{j\frac{2\pi}{T}n} + a_2 e^{j\frac{4\pi}{t}n} + \ldots] \\ &= \delta(\theta) + a_1\delta\left(\theta - \frac{2\pi}{T}\right) + \\ & \quad a_2\delta\left(\theta - \frac{4\pi}{T}\right) + \ldots\end{aligned} \quad (9)$$

In other words, $S(\omega,\theta)$ can be expressed by the image signal at rest and convolution of the impulse train in the direction of the phase axis. The terms after the term $$a_1\delta\left(\theta - \frac{2\pi}{T}\right)$$

become the artifact component.

A processing D for converting the still image component $S_o(t,n)$ and the artifact component $\exp(j\Delta\theta(n))$ into a mutually separable form, a processing L for removing the artifact under such a condition and a processing $D^{-1}$ for effecting inversion of the processing D are incorporated for the artifact occurring due to the mechanism described above in or after the image reconstruction processing and by so doing, there can be obtained an image free from artifact. Needless to say, this can be accomplished by the computer 109.

Figure 3A:
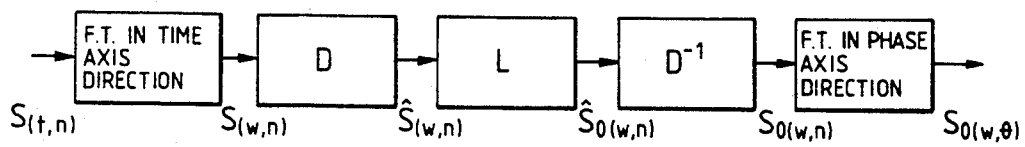
FIGS. 3a-3c are block diagrams showing an example of the image processing flow on the basis of the present invention.
Figure 3B:
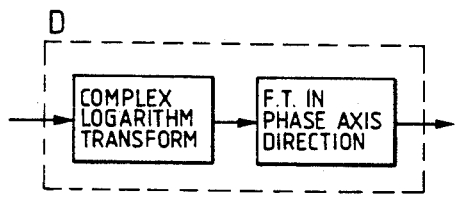
Figure 3C:
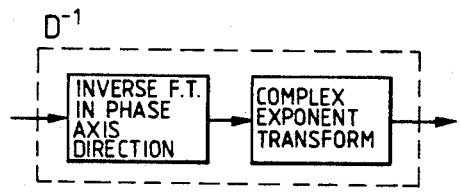

FIGS. 3a-c show the processing flow when they are incorporated in the reconstruction processing. When the NMR signal S(t, n) obtained from the sample oscillating periodically is subjected to Fourier transform in the direction of the time axis, $$\begin{aligned}S(\omega,n) &= \rho\delta(\omega - \omega_k)\exp\{j(\theta_j m + \Delta\theta(n))\} \\ &= \rho\delta(\omega - \omega_k)\exp(j\theta_j m)\exp(j\Delta\theta(n))\end{aligned} \quad (10)$$

The processing D is conducted for the above. First of all, the coupling of multiplication is transformed to the coupling of sum by complex logarithm transform.

$$\log[S(\omega,n)] = \log[\rho\delta(\omega - \omega_k)\cdot\exp(j\theta_j m)] + \log[\exp(\Delta\theta(n))] \quad (11)$$

The latter half of the formula (11) is then developed. As described previously, $$\log[\exp(j\Delta\theta(n))] = \log[1 + a_1 e^{j\frac{2\pi}{T}n} + a_2 e^{j\frac{4\pi}{T}n} + \ldots] \quad (12)$$

If this is subjected to Taylor expansion, there can be obtained a periodic function, too:

$$\begin{aligned}\log[1 + a_1 e^{j\frac{2\pi}{T}n} + a_2 e^{j\frac{4\pi}{T}n} + \ldots] = \\ b_1 e^{j\frac{2\pi}{T}n} + b_2 e^{j\frac{4\pi}{T}n} + b_3 e^{j\frac{6\pi}{T}n} + \ldots\end{aligned} \quad (13)$$

Therefore, the result of Fourier transform of the formula (11) is given as follows:

$$\hat{S}(\omega,n) = \hat{S}_o(\omega,n) + b_1\delta\left(\omega - \frac{2\pi}{T}\right) + b_2\delta\left(\omega - \frac{4\pi}{T}\right) + \ldots \quad (14)$$

However, $\hat{S}_o(\omega,n)$ represents the application of the processing D to the former half of the formula (11), that is, to the still image component.

As expressed by the formula (14), the artifact component appears as the peak every $2\pi/T$. On the other hand, $\hat{S}_o(\omega, n)$ appears near the zero point of abscissa. For, complex logarithm transform has the function of compressing the function besides the functions described above. For example, if logarithm transform is made, large values can be compressed to small values as represented below:

$$\log(e^2) = \log(7.389) = 2$$

$$\log(e^{10}) = \log(22026) = 10$$

Therefore, even though the still image component which is not periodic exhibits a vigorous change before logarithm transform, its change becomes gentle after logarithm transform. In contrast, even if logarithm transform is made to the artifact component which is periodical, the component is transformed to the same periodic function. Therefore, the still image component and the artifact component can be separated by Fourier transform.

Here, the processing L is applied. This processing L is linear filtering which removes only the artifact component.

Then, the processing $D^{-1}$ is applied to the remaining still image component or in other words, inverse Fourier transform is made in the direction of the phase axis, and thereafter complex exponent transfer is made. There is thus established the state which corresponds to the intermediate stage of the ordinary image reconstruction processing. Then, Fourier transform is made in the direction of the phase axis to obtain the image. In this manner the still image can be obtained.

Figure 4:
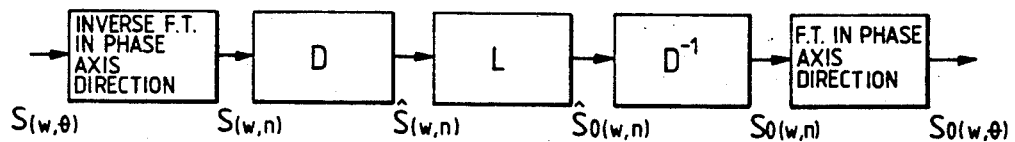
FIG. 4 is a block diagram showing another example of the image processing flow on the basis of the present invention.

The similar processing to the above is applied to the real number value image containing the artifact for which image reconstruction has already been made, and the artifact can thus be removed. Its processing flow is shown in FIG. 4. In contrast with FIG. 3, processing can be executed by merely changing Fourier transform in the direction of the time axis by inverse Fourier transform in the direction of the phase axis.

Figure 5:
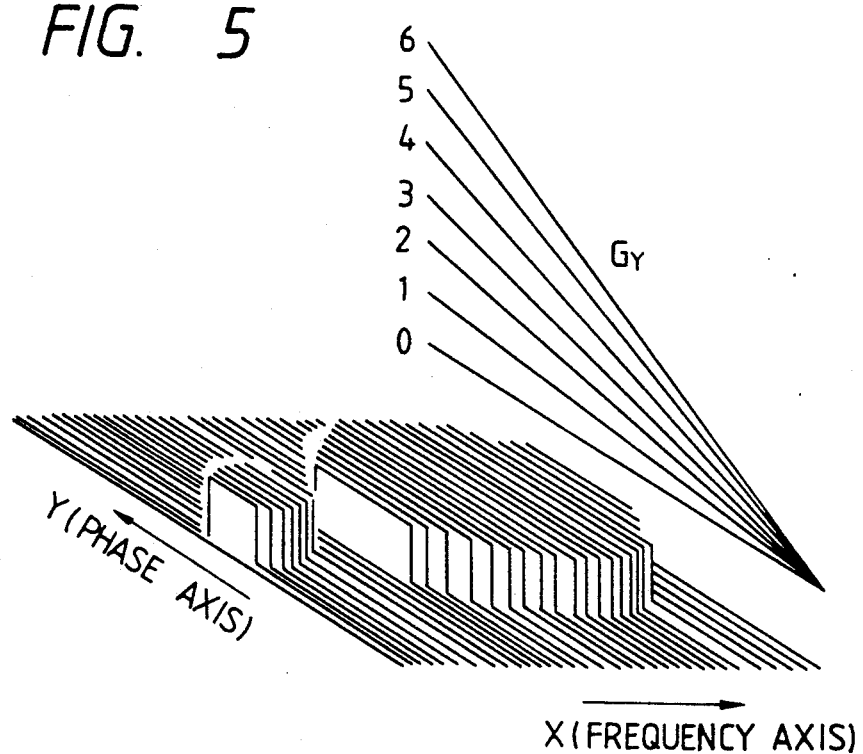
FIG. 5 shows of a sample or object to be imaged.
Figure 6:
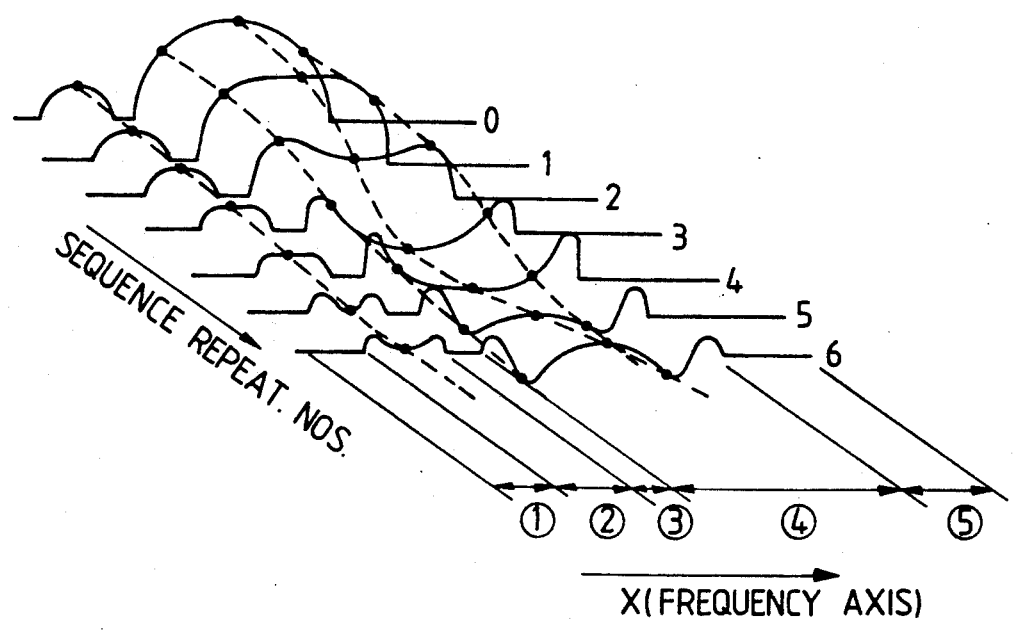
FIG. 6 shows a signal profile relating to the sample or object shown in FIG. 5.

Next, the method of reducing the processing time will be described. When the sample shown in FIG. 5 is to be imaged, for example, the signal assumes the form such as shown in FIG. 6 in the processing shown in FIGS. 3 and 4 before the processing D is carried out. Under this state a certain threshold value is set and the portions having small signal intensity such as (1), (3) and (5) and the portions having high signal intensity such as (2) and (4) are distinguished as shown in FIG. 5. The processing time can be reduced by applying the processings D, L and $D^{-1}$ to the portions having high signal intensity such as (2) and (4).

Although the present invention has thus been described with reference to one preferred form thereof, it would be obvious to those skilled in the art that the embodiment is not particularly limitative and many changes and modifications could be made by those skilled in the art without departing from the spirit and scope of the appended claims.

What is claimed is:

1. A magnetic resonance imaging method comprising the steps of disposing a sample in a static magnetic field, applying a radio frequency magnetic field to the sample while applying a magnetic field gradient to the static magnetic field, varying the magnetic field gradient in amplitude in a step manner to thereby produce a plurality of nuclear magnetic resonance signals from the sample, applying image reconstruction processing to at least one of the plurality of nuclear magnetic resonance signals, and during the image reconstruction processing step performing the following steps:

(1) transforming the at least one of the plurality of nuclear magnetic resonance signals into a signal of a form wherein a still image component and an artifact component attributable to motion of the sample are separated from each other; and
    (2) filtering the transformed signal to thereby remove the artifact component therefrom;
    wherein the steps (1) and (2) are performed to the at least one of the plurality of nuclear magnetic resonance signals which exceeds a predetermined threshold value.

2. A magnetic resonance imaging method according to claim 1, wherein the motion of the sample is substantially periodic.

3. A magnetic resonance imaging method comprising the steps of disposing a sample in a static magnetic field, applying a radio frequency magnetic field to the sample while applying a magnetic field gradient to the static magnetic field, varying the magnetic field gradient in amplitude in a step manner to thereby produce a plurality of nuclear magnetic resonance signals from the sample, applying image reconstruction processing to at least one of the plurality of nuclear magnetic resonance signals, and during the image reconstruction processing step performing the following steps:

(1) transforming the at least one of the plurality of nuclear magnetic resonance signals into a signal of a form wherein a still image component and an artifact component attributable to motion of the sample are separated from each other;
    (2) filtering the transformed signal to thereby remove the artifact component therefrom; and
    (3) applying an inverse transform to the filtered signal;
    Wherein the nuclear magnetic resonance signal transforming step, the signal filtering step and the inverse transform applying step are performed to the at least one of the plurality of nuclear magnetic resonance signals which exceeds a predetermined threshold value.

4. A magnetic resonance imaging method according to claim 3, wherein the motion of the sample is substantially periodic.

5. A magnetic resonance imaging method comprising the steps of disposing a sample in a static magnetic field, applying a radio frequency magnetic field to the sample while applying a magnetic field gradient to the static magnetic field, varying the magnetic field gradient in amplitude in a step manner to thereby produce a plurality of nuclear magnetic resonance signals from the sample, and applying image reconstruction processing to at least one of the plurality of nuclear magnetic resonance signals, and after the image reconstruction processing applying step performing the following steps:

(1) transforming the at least one of the plurality of nuclear magnetic resonance signals into a signal of a form wherein a still image component and an artifact component attributable to motion of the sample are separated from each other; and
    (2) filtering the transformed signal to thereby remove the artifact component therefrom;
    wherein the steps (1) and (2) are performed to the at least one of the plurality of nuclear magnetic resonance signals which exceeds a predetermined threshold.

6. A magnetic resonance imaging method according to claim 5, wherein the motion of the sample is substantially periodic.

7. A magnetic resonance imaging method comprising the steps of disposing a sample in a static magnetic field, applying a radio frequency magnetic field to the sample while applying a magnetic field gradient to the static magnetic field, varying the magnetic field gradient in amplitude in a step manner to thereby produce a plurality of nuclear magnetic resonance signals from the sample, and applying image reconstruction processing to at least one of the plurality of nuclear magnetic resonance signals, and after the image reconstruction processing applying step performing the following steps:

(1) transforming the at least one of the plurality of nuclear magnetic resonance signals into a signal of a form wherein a still image component and an artifact component attributable to motion of the sample are separated from each other;
    (2) filtering the transformed signal to thereby remove the artifact component therefrom; and
    (3) applying an inverse transform to the filtered signal;
    wherein the nuclear magnetic resonance signal transforming step, the signal filtering step and the inverse transform applying step are performed to the at least one of the plurality of nuclear magnetic resonance signals which exceeds a predetermined threshold value.

8. A magnetic resonance imaging method according to claim 7, wherein the motion of the sample is substantially periodic.

9. A magnetic resonance imaging method comprising the steps of disposing a sample in a static magnetic field, applying a radio frequency magnetic field to the sample while applying a magnetic field gradient to the static magnetic field, varying the magnetic field gradient in amplitude in a step manner to thereby produce a plurality of nuclear magnetic resonance signals from the sample, and forming an image of the sample on the basis of the plurality of nuclear magnetic resonance signals, the image forming step including the steps of:

(1) applying a Fourier transformation to at least one of the plurality of nuclear magnetic resonance signals in the direction of a time axis, (2) applying a complex logarithm transformation to the signal subjected to the Fourier transformation, (3) applying a Fourier transformation to the signal subjected to the complex logarithm transformation in a direction of a phase axis to obtain a signal containing a still image component and an artifact image component separated from the still image component and resulting from motion of the sample, (4) filtering the obtained signal to remove the artifact image component therefrom, (5) applying an inverse Fourier transformation to the filtered signal in the direction of the phase axis, and (6) applying a complex exponent transformation to the signal subjected to the inverse Fourier transformation.

10. A magnetic resonance imaging method according to claim 9, wherein the image forming step is applied to each of the plurality of nuclear magnetic resonance signals.

11. A magnetic resonance imaging method according to claim 9, wherein the artifact image component results from periodic motion of the sample.

12. A magnetic resonance imaging method comprising the steps of disposing a sample in a static magnetic field, applying a radio frequency magnetic field to the sample while applying a magnetic field gradient to the static magnetic field, varying the magnetic field gradient in amplitude in a step manner to produce a plurality of nuclear magnetic resonance signals from the sample, applying image reconstruction processing to at least one of the plurality of nuclear magnetic resonance signals, and one of during and after the image reconstruction processing applying step performing the following steps:

(1) applying a Fourier transformation to at least one of the plurality of nuclear magnetic resonance signals in a direction of a time axis, (2) applying a complex logarithm transformation to the signal subjected to the Fourier transformation, (3) applying a Fourier transformation to the signal subjected to the complex logarithm transformation in a direction of a phase axis to obtain a signal containing a still image component and an artifact image component separated from the still image component and resulting from periodic motion of the sample, (4) filtering the obtained signal to remove the artifact image component therefrom, (5) applying an inverse Fourier transformation to the filtered signal in the direction of the phase axis, and (6) applying a complex exponent transformation to the signal subjected to the inverse Fourier transformation.

13. A magnetic resonance imaging method according to claim 12, wherein the steps (1) through (6) are perfomed to the at least one of the plurality of nuclear magnetic resonance signals which exceeds a predetermined threshold value.

14. A magnetic resonance imaging method according to claim 12, wherein image reconstruction processing is applied to each of the plurality of nuclear magnetic resonance signals and steps (1) through (6) are performed to each of the plurality of nuclear magnetic resonance signals.

* * * * *